(12) United States Patent
Chen et al.

(10) Patent No.: US 7,119,405 B2
(45) Date of Patent: Oct. 10, 2006

(54) IMPLANTATION METHOD TO IMPROVE ESD ROBUSTNESS OF THICK GATE-OXIDE GROUNDED-GATE NMOSFET'S IN DEEP-SUBMICRON CMOS TECHNOLOGIES

(75) Inventors: Jau-Wen Chen, Milpitas, CA (US); Yoon Huh, Milpitas, CA (US); Erhong Li, Sunnyvale, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 11/056,641

(22) Filed: Feb. 11, 2005

(65) Prior Publication Data

US 2006/0180863 A1 Aug. 17, 2006

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl. ............ 257/391; 257/392; 257/355; 257/546; 257/336; 257/344; 257/E21.443

(58) Field of Classification Search ........ 257/392, 257/355, 546, 391, 336, 344, 408, E21.443
See application file for complete search history.

(56) References Cited

U.S. PATENT DOCUMENTS

| | | | |
|---|---|---|---|
| 5,374,565 A | | 12/1994 | Hsue et al. |
| 5,627,527 A | | 5/1997 | Mehta |
| 6,143,594 A | * | 11/2000 | Tsao et al. ........... 438/199 |
| 6,882,011 B1 | * | 4/2005 | Chen ................... 257/355 |
| 6,972,446 B1 | * | 12/2005 | Atsumi ................ 257/208 |
| 2002/0127791 A1 | * | 9/2002 | Nanjo et al. ......... 438/231 |
| 2003/0173630 A1 | * | 9/2003 | Lin et al. ............. 257/406 |
| 2005/0275028 A1 | * | 12/2005 | Steinhoff ............. 257/355 |

* cited by examiner

*Primary Examiner*—Kenneth Parker
*Assistant Examiner*—Jesse A. Fenty
(74) *Attorney, Agent, or Firm*—Trexler, Bushnell, Giangiorgi & Blackstone, Ltd.

(57) ABSTRACT

An implantation method to improve ESD robustness of thick-oxide grounded-gate NMOSFET's in deep-submicron CMOS technologies. Based on standard process flow in DGO, a thick gate-oxide ESD device is improved. Instead of using the standard I/O device, the ESD device uses the thin-oxide N-LDD implantation, and thus its ESD robustness is enhanced. This is performed by updating the logic Boolean operations of thick gate-oxide and thin gate-oxide N-LDD before fabricating the masks. In TGO, the intermediate-oxide ESD uses thin-oxide N-LDD implantation, and the thick-oxide ESD uses intermediate-oxide N-LDD implantation.

3 Claims, 17 Drawing Sheets

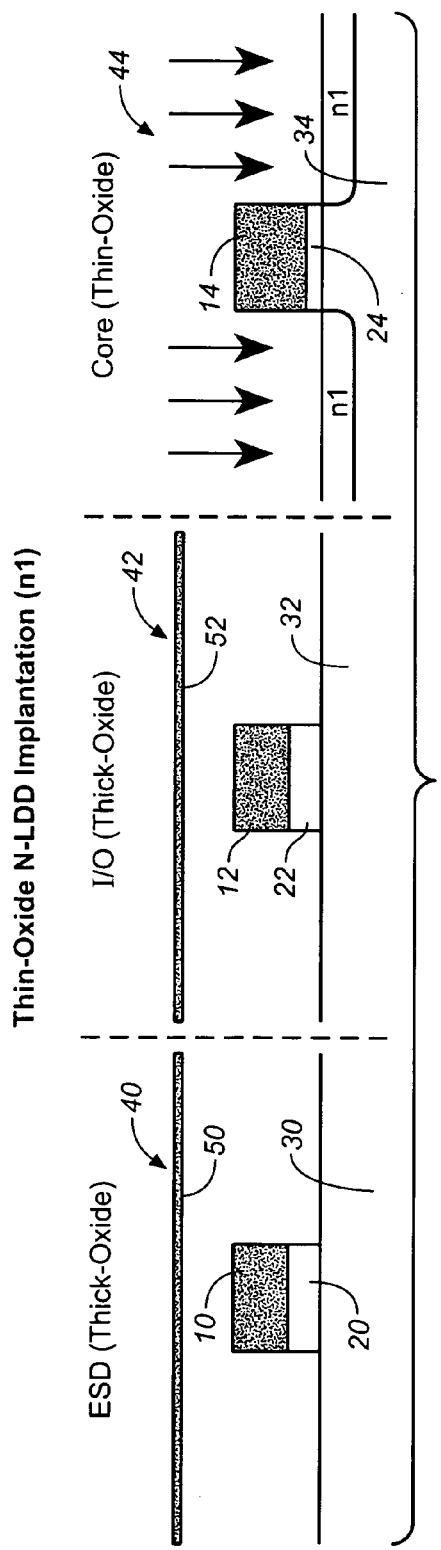
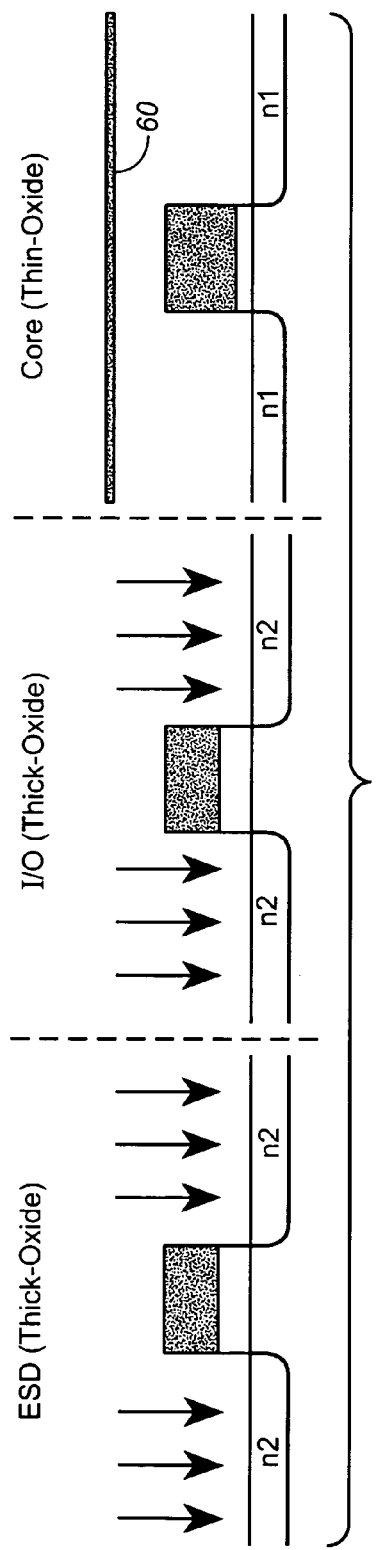
FIG. 1A (PRIOR ART)
FIG. 1B (PRIOR ART)

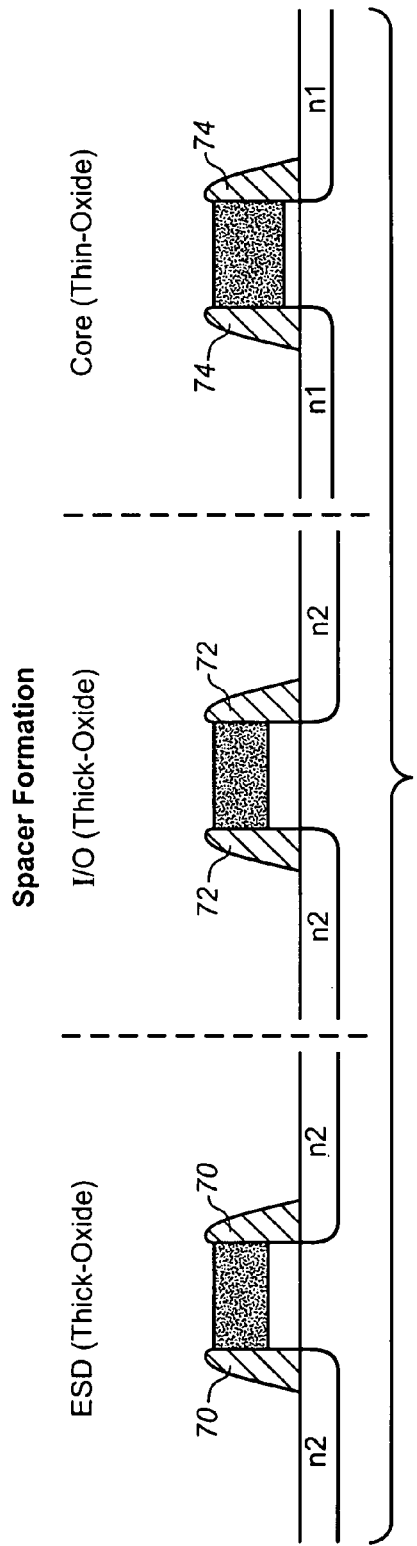
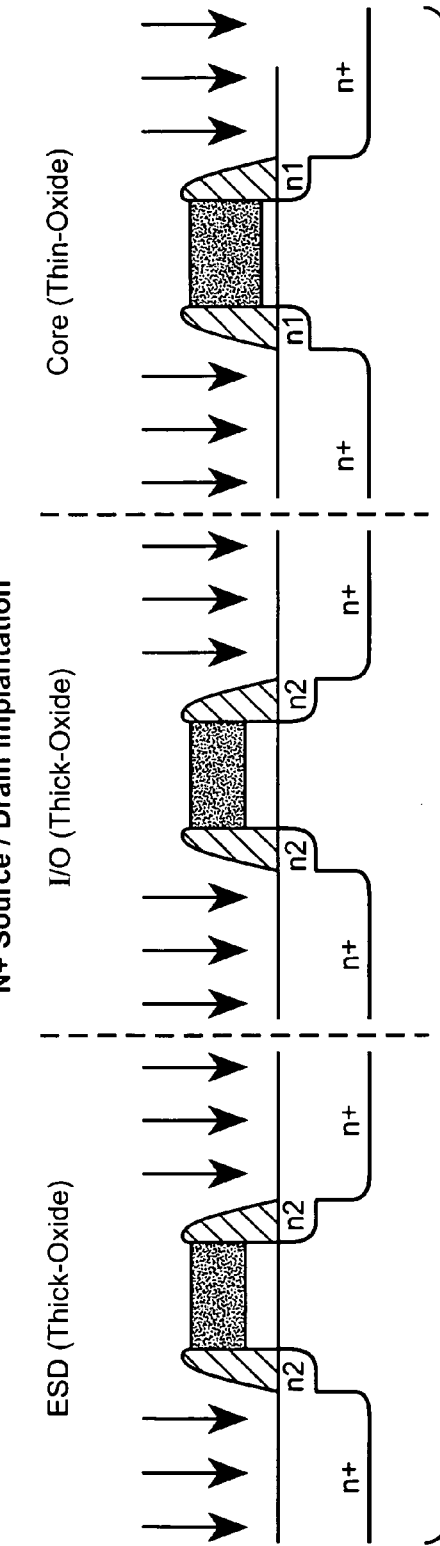
FIG. 1C (PRIOR ART)
FIG. 1D (PRIOR ART)

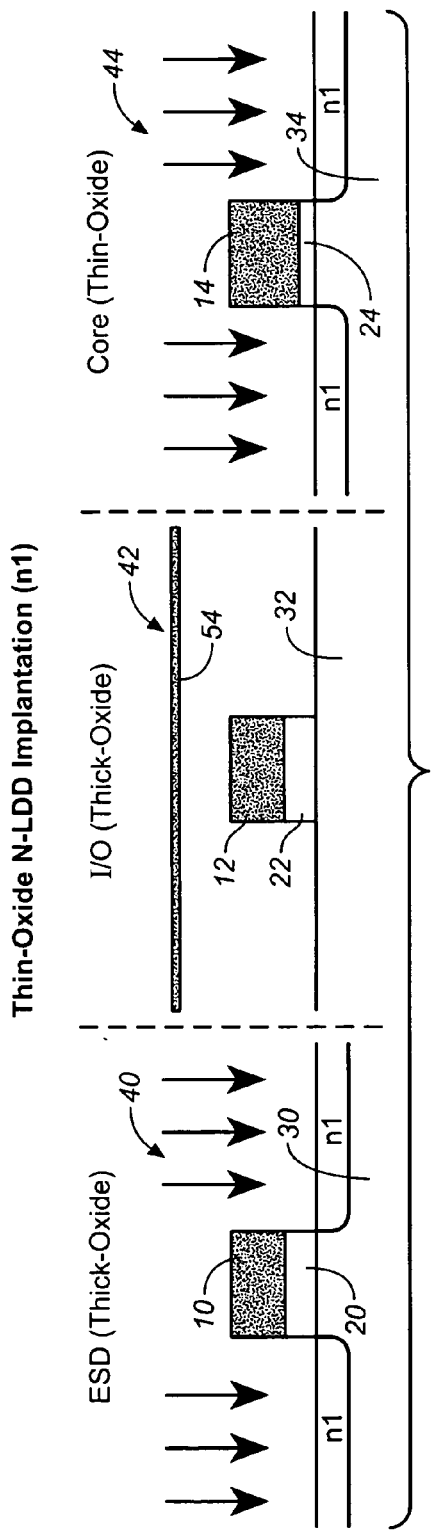
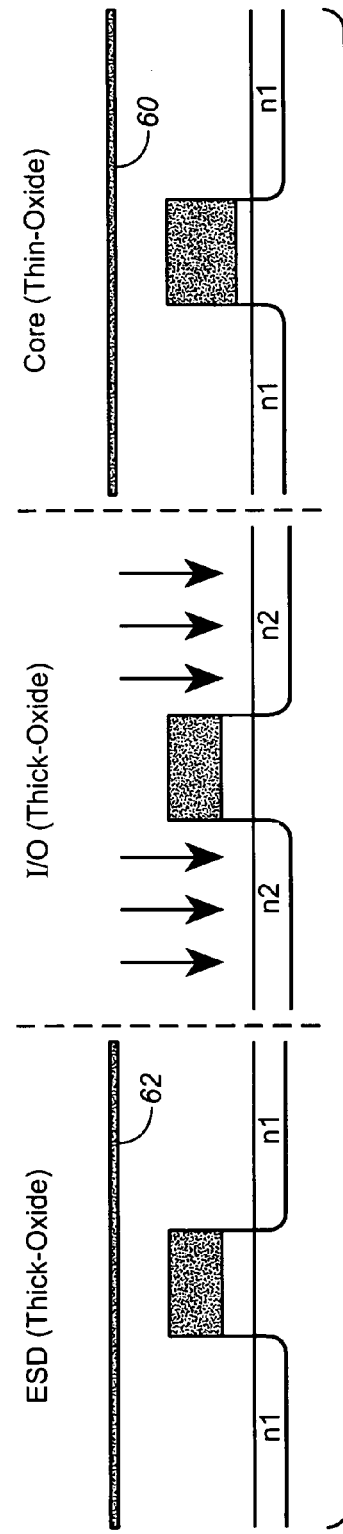
FIG. 2A
FIG. 2B

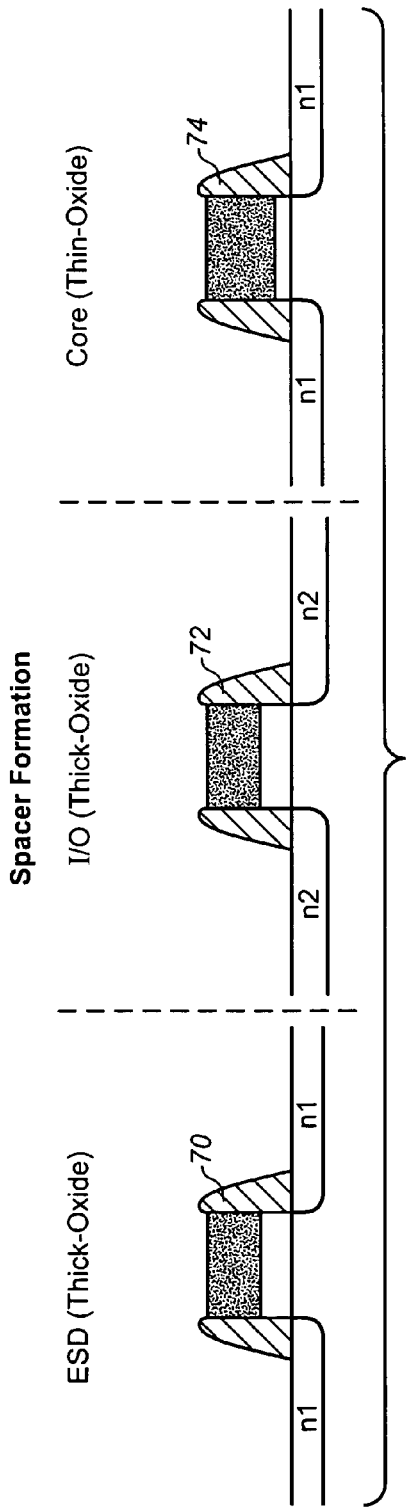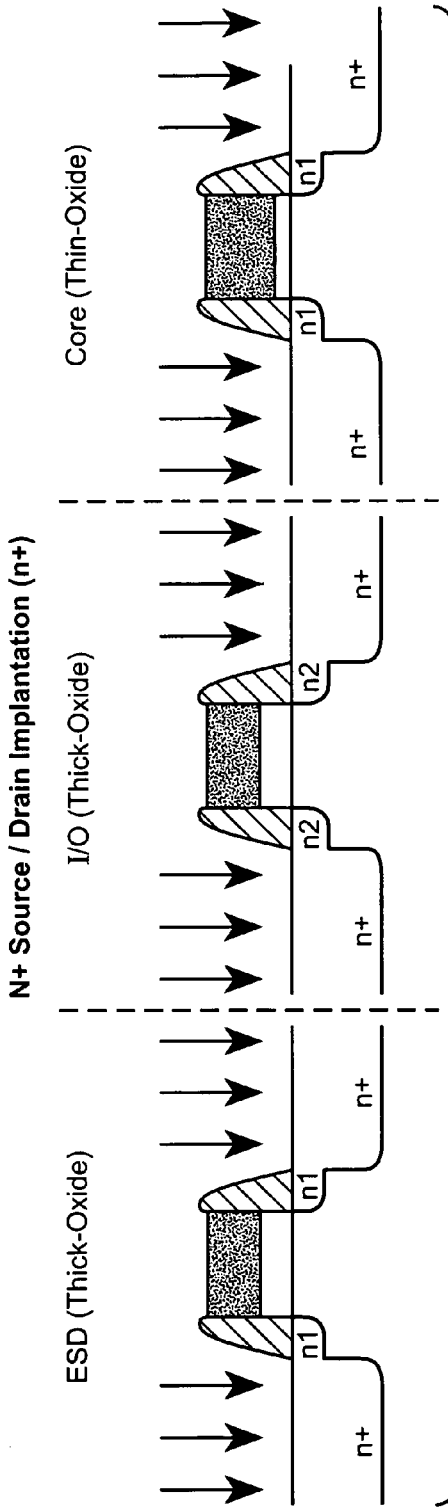

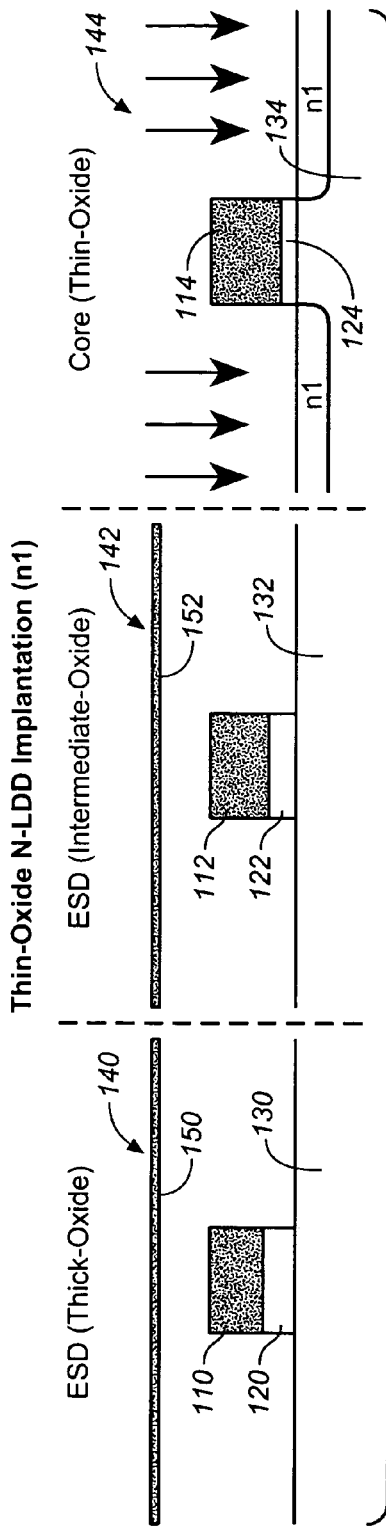
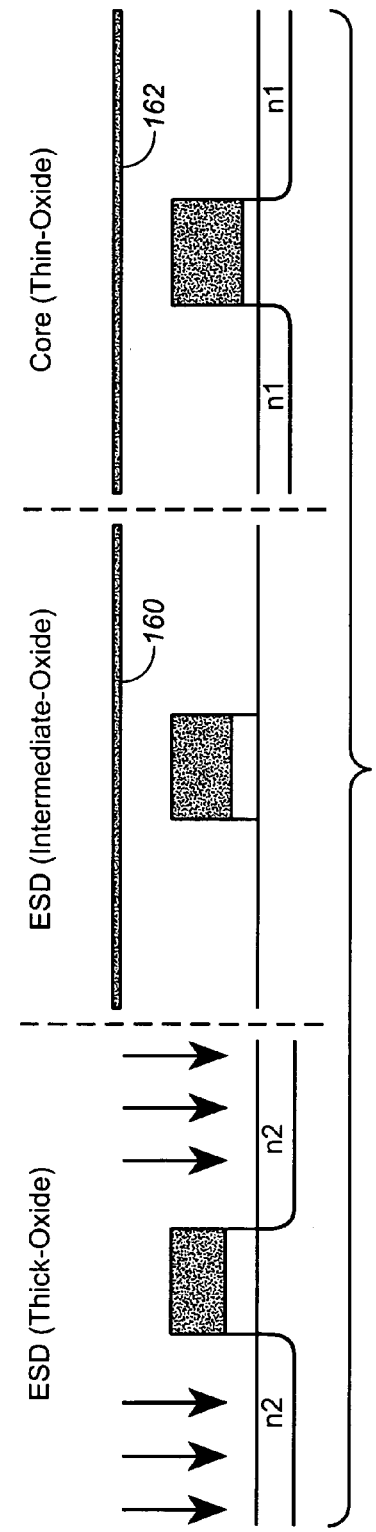
*FIG. 3A (PRIOR ART)*
*FIG. 3B (PRIOR ART)*

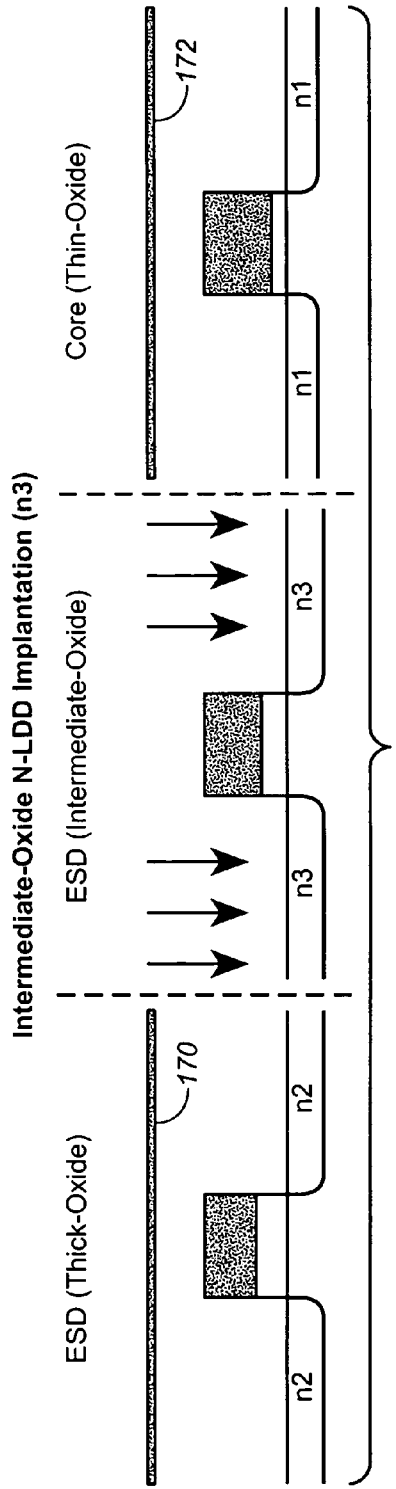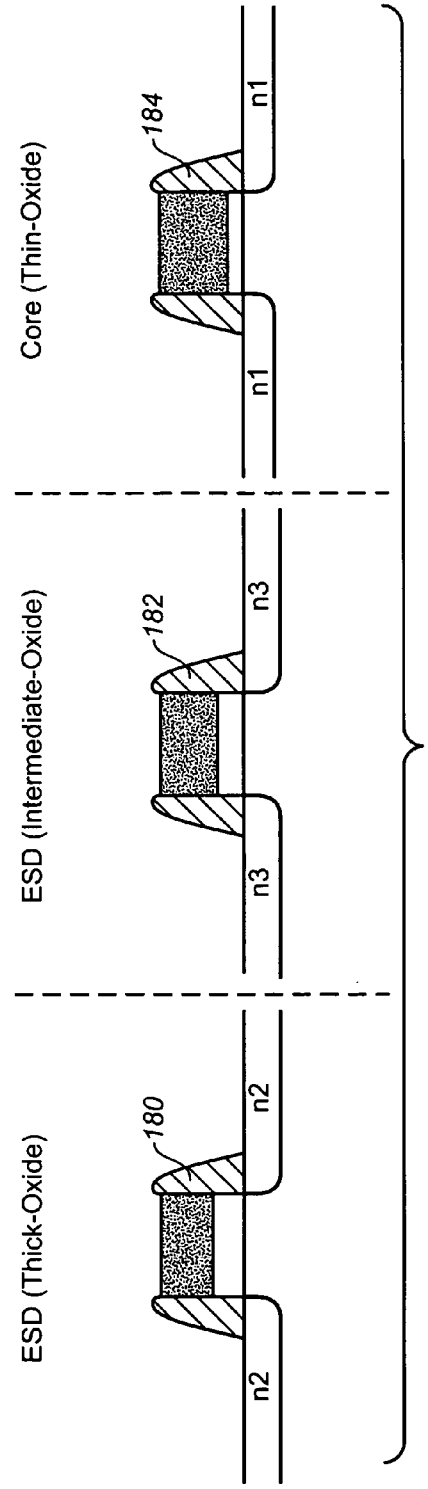
FIG. 3C (PRIOR ART)
FIG. 3D (PRIOR ART)

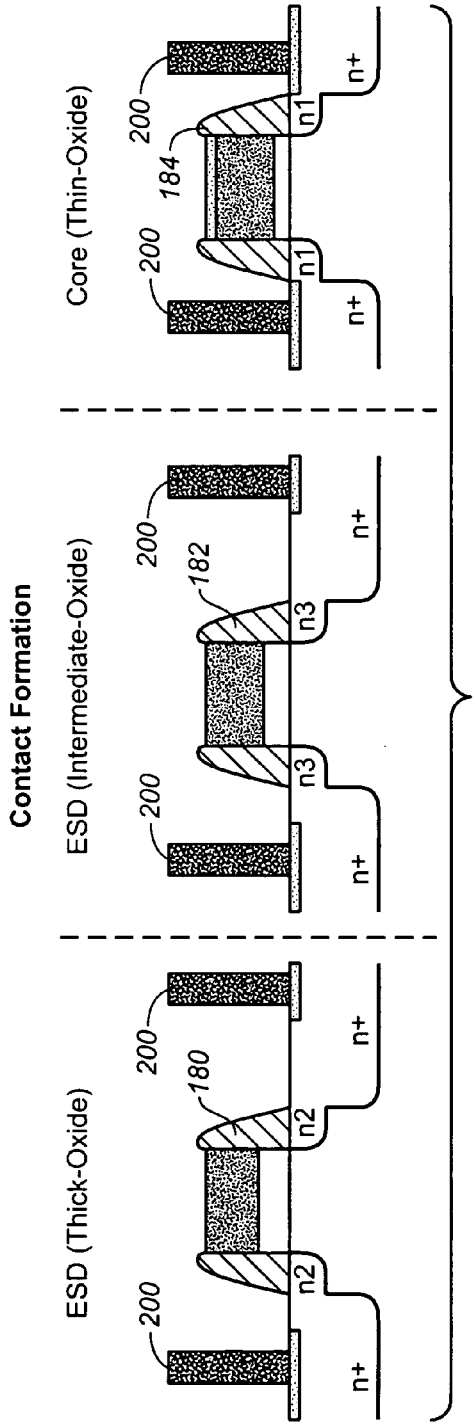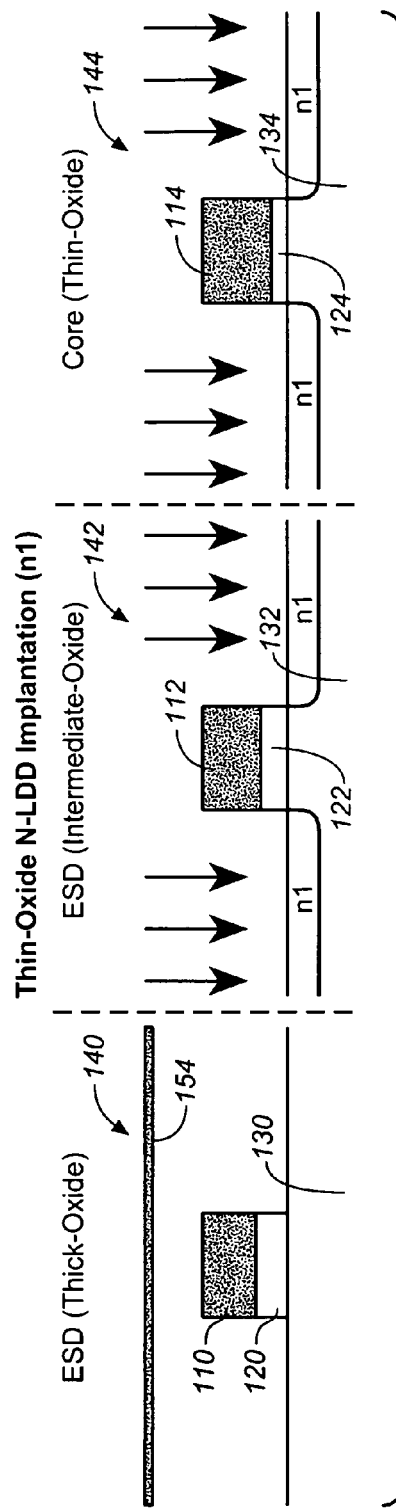
FIG. 3G (PRIOR ART)
FIG. 4A

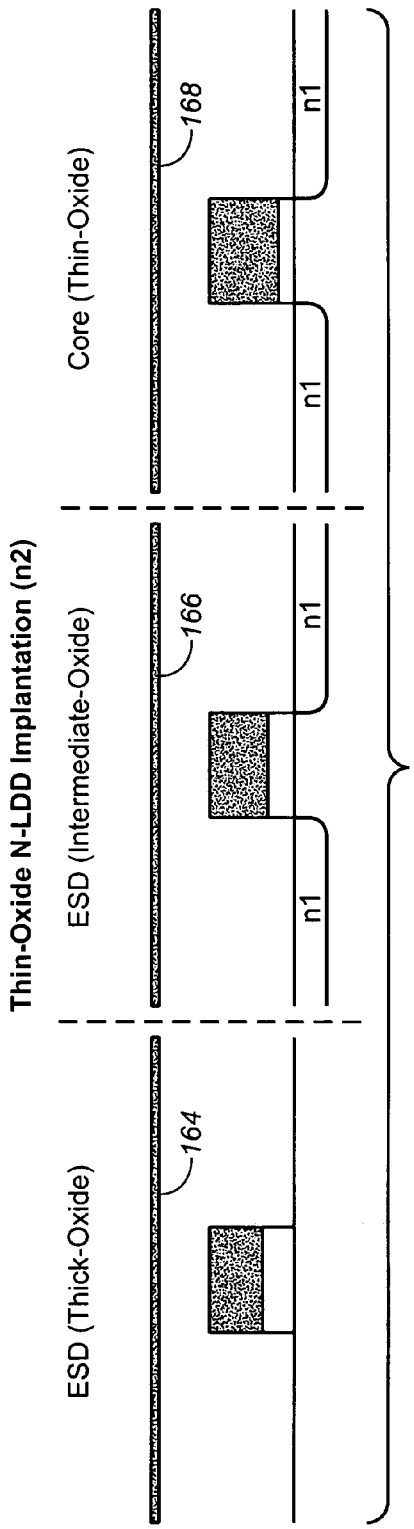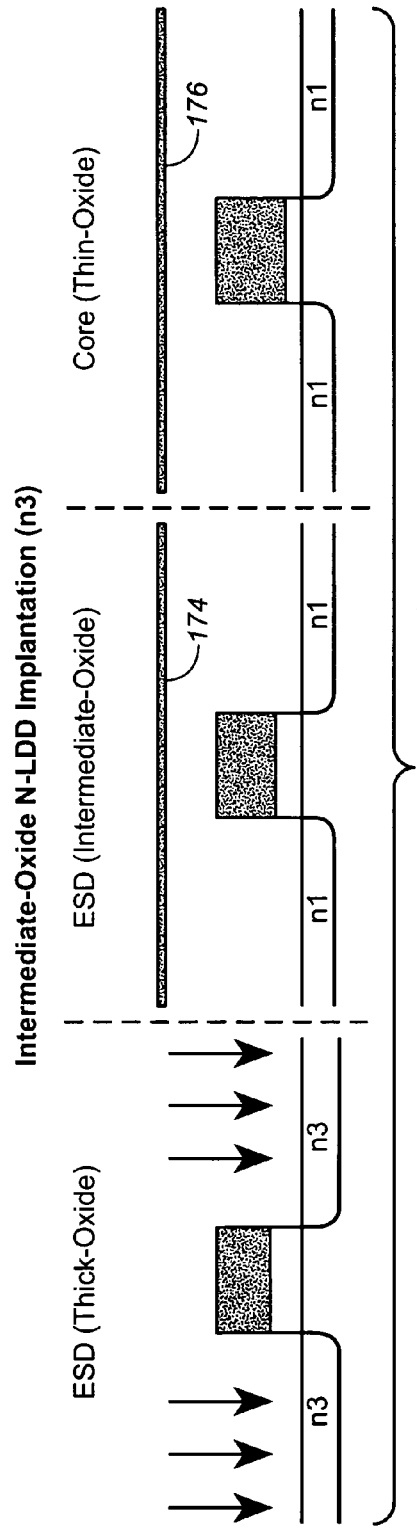

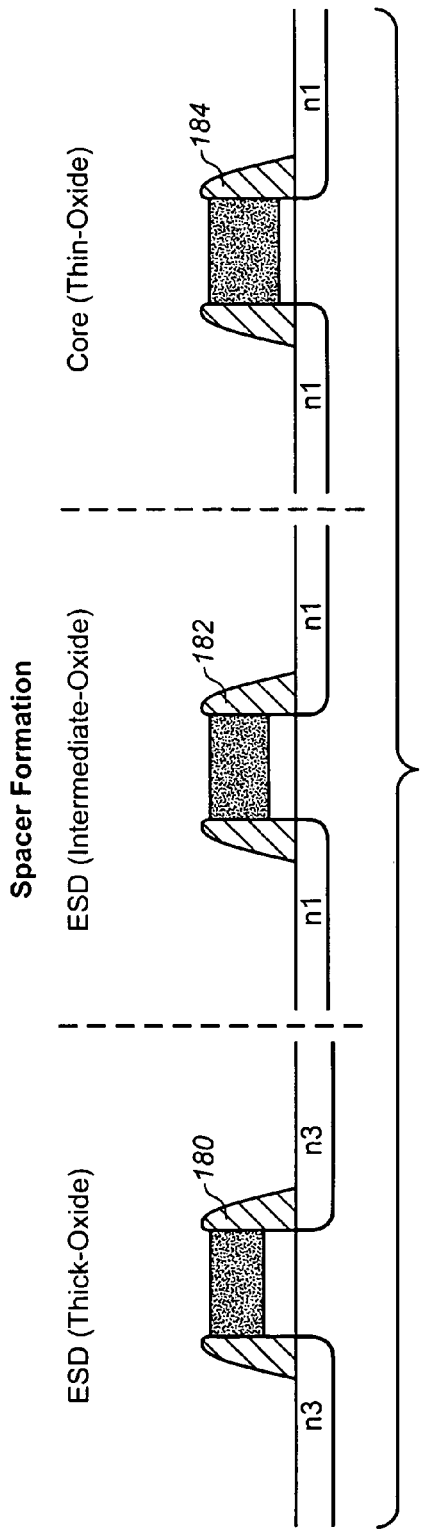
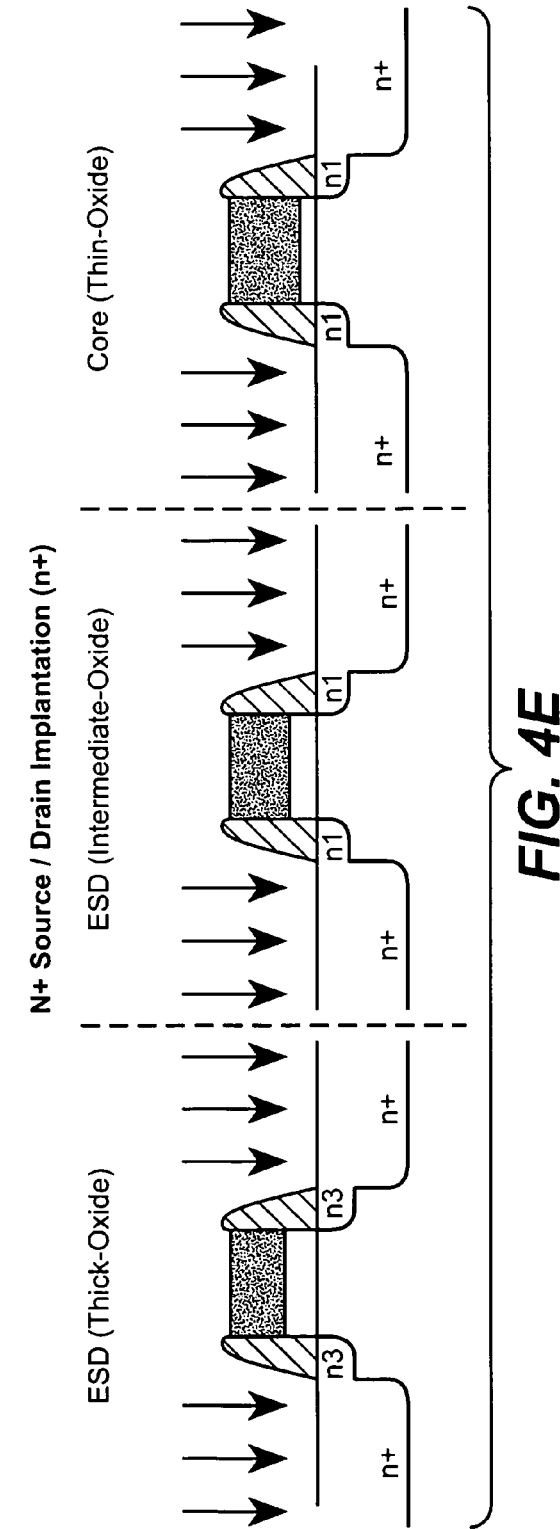

FIG. 5A *(PRIOR ART)*

IMPLANTATION METHOD TO IMPROVE ESD ROBUSTNESS OF THICK GATE-OXIDE GROUNDED-GATE NMOSFET'S IN DEEP-SUBMICRON CMOS TECHNOLOGIES

BACKGROUND

The present invention generally relates to electrostatic discharge (ESD) protection devices in complementary metal-oxide semiconductor (CMOS) technologies, and more specifically relates to an implantation method to improve ESD robustness of thick-oxide grounded-gate NMOSFET's (metal-oxide-semiconductor flied effect transistor with n-type channel) in deep-submicron CMOS technologies.

In CMOS technologies, grounded-gate NMOS fingers (ggNMOSFET's) without silicide are widely used as the primary ESD protection device in I/O buffers and power rail clamps because of ESD robustness. However, in order to overcome the hot carrier injection lifetime issue, lightly-doped drain (LDD) doping concentration is very low for 2.5V and 3.3V NMOS devices using thick gate-oxide in process. This often leads to a lower ESD protection performance in thick gate-oxide ggNMOSFET's. Therefore, ESD robustness of standard 2.5V and 3.3V ggNMOSFET's without silicide are limited by LDD implantation.

In order to enhance ESD robustness, ESD implants had been reported and included into process flow to modify the thick gate-oxide device structures for ESD protection. See, for example, U.S. Pat. Nos. 5,672,527 and 5,374,565, both of which are incorporated herein by reference in their entirety. In U.S. Pat. No. 5,672,527, the N-type ESD implantation was used to cover the LDD structure and make a deeper junction in thick gate-oxide device structures for ESD protection. In U.S. Pat. No. 5,374,565, the P-type ESD implantation with a higher doping concentration located under the drain junction of thick gate-oxide NMOS device was used to reduce the junction breakdown voltage and earlier turn on the parasitic lateral BJT of the NMOS device. These two approaches are well-known methods used in the foundry processes, especially for stacked-gate NMOS fingers for 5V-tolerant I/O ESD protection. However, an extra ESD implant mask is required for these approaches and thus increase the process cycle time. In these approaches, a longer drain-contact-to-gate spacing (DCGS) is also needed for improvement of ESD robustness.

OBJECTS AND SUMMARY

An object of an embodiment of the present invention is to provide a novel implementation method to improve ESD robustness of thick gate-oxide ggNMOSFET's.

Another object of an embodiment of the present invention is to create new ggNMOSFET's for ESD protection based on the existing process flow.

Yet another object of an embodiment of the present invention is to create a novel thick gate-oxide ggNMOSFET by recombining LDD implantation, within the existing process flow.

Briefly, an embodiment of the present invention provides an implantation method to improve ESD robustness of thick-oxide grounded-gate NMOSFET's in deep-submicron CMOS technologies. Based on standard process flow in DGO, a thick gate-oxide ESD device is improved. Instead of using the standard I/O device, the ESD device uses the thin-oxide N-LDD implantation, and thus its ESD robustness is enhanced. This is performed by updating the logic Boolean operations of thick gate-oxide and thin gate-oxide N-LDD before fabricating the masks. In TGO, the intermediate-oxide ESD uses thin-oxide N-LDD implantation, and the thick-oxide ESD uses intermediate-oxide N-LDD implantation.

BRIEF DESCRIPTION OF THE DRAWINGS

The organization and manner of the structure and operation of the invention, together with further objects and advantages thereof, may best be understood by reference to the following description, taken in connection with the accompanying drawings, wherein:

FIGS. 1A through 1F illustrate the standard process flow for dual gate-oxide (DGO) process;

FIGS. 2A through 2F illustrate the process flow for DGO process in accordance with an embodiment of the present invention;

FIGS. 3A through 3G illustrate the standard process flow for triple gate-oxide (TGO) process;

FIGS. 4A through 4G illustrate the process flow for TGO process in accordance with an embodiment of the present invention;

FIG. 5A provides a cross-sectional view of a standard ggNMOSFET without silicide;

DESCRIPTION

Figure 1E:
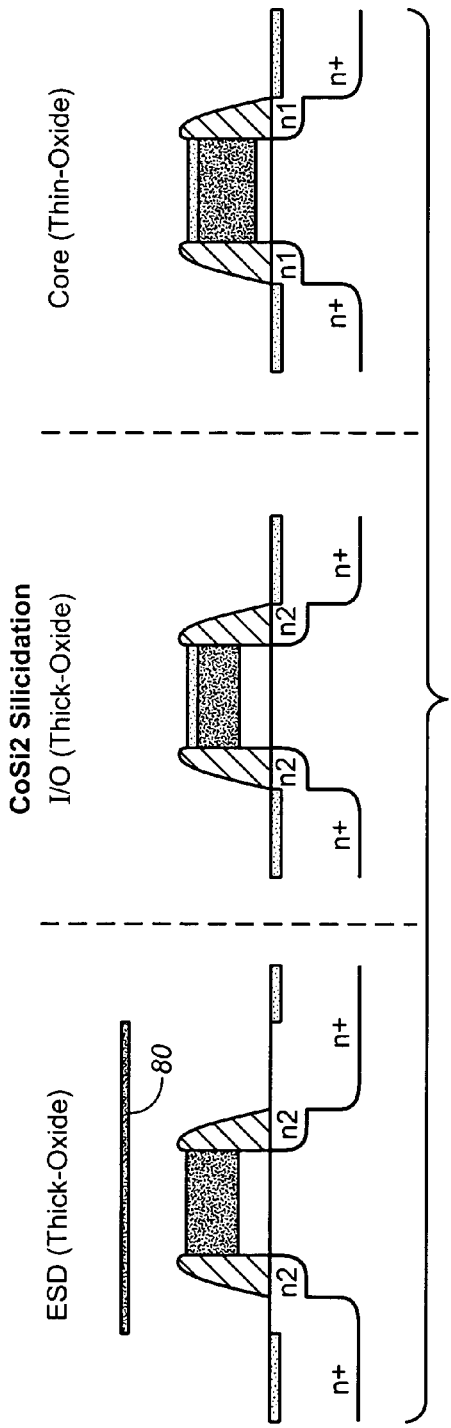

While the invention may be susceptible to embodiment in different forms, there are shown in the drawings, and herein will be described in detail, specific embodiments of the invention. The present disclosure is to be considered an example of the principles of the invention, and is not intended to limit the invention to that which is illustrated and described herein.

The purpose is to use the present invention in 2.5V/3.3V/ 5V-tolerant I/O and power clamp applications for the technology nodes less than 0.18 um, e.g., Gflx (130 nm), G90 (90 nm), G65 (65 nm), etc.

The present invention applies to all deep-submicron CMOS technologies with multiple gate-oxide process. In industry, dual gate-oxide (DGO) process and triple gate-oxide (TGO) process are used currently. Therefore, these two processes are described herein in connection with the present invention.

In deep-submicron CMOS technology, dual gate-oxide (DGO) process has been achieved after the 0.18 um technology node. After the 90 nm technology node, triple gate-oxide (TGO) process is also applied to meet the requirements of IC designs. In DGO process, two different LDD implantation masks are required for thick and thin gate-oxide NMOS devices, respectively. In TGO process, three different LDD implantation masks are used for thick, medium and thin gate-oxide NMOS devices, respectively.

In DGO process, there are two standard N-type lightly doped drain (N-LDD) implantation masks. The standard process flow for DGO is shown in FIG. 1A through FIG. 1F. In these Figures, "n1" is N-LDD implantation for thin gate-oxide transistors and "n2" is N-LDD implantation for thick gate-oxide transistors. Due to device performance and reliability, the doping concentration of "n1" is higher than that of "n2". In the standard ESD protection approach, except for an additional silicide block, the ESD device is same as the I/O device. To improve its ESD robustness, usually an additional ESD implantation mask and additional process steps are implemented (not shown in FIGS. 1A through 1F, but see U.S. Pat. No. 5,672,527). Hence, this approach increases the process cycle time and complicates the process flow.

Based on the standard process flow, the thick gate-oxide ESD device is improved by using the present invention as shown in FIGS. 2A through 2F. Instead of using the standard I/O device, the ESD device uses the thin-oxide N-LDD implantation, and thus its ESD robustness is enhanced. This is performed by updating the logic Boolean operations of thick gate-oxide and thin gate-oxide N-LDD before fabricating the masks. It should be noted that the process flows are identical in FIGS. 1A through 1F compared to FIGS. 2A through 2F, and this will be apparent from the following description.

Figure 2E:
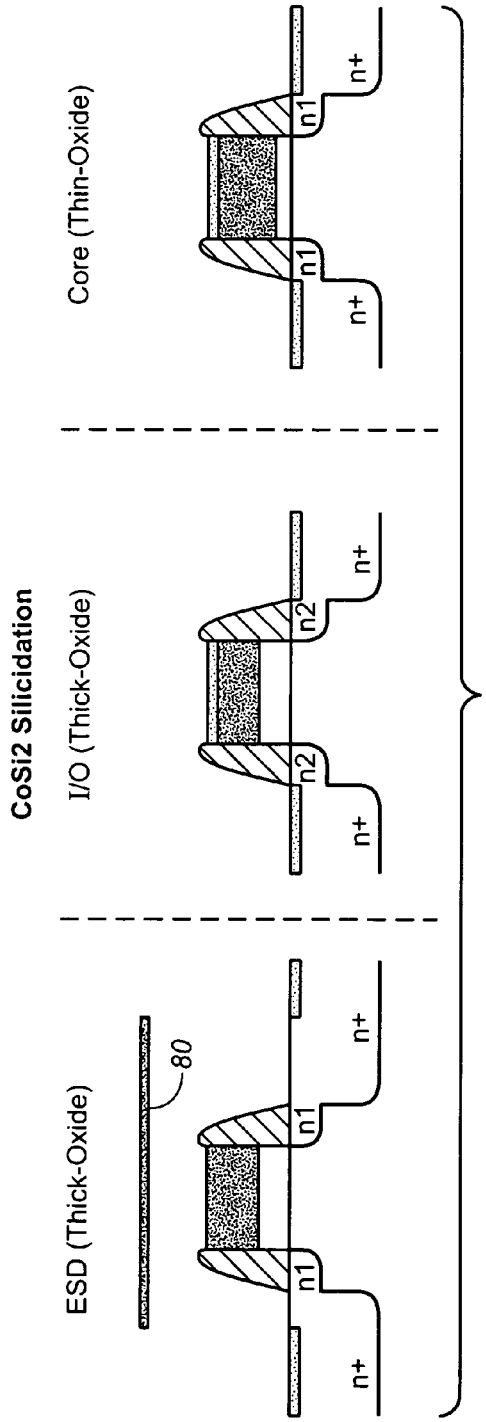

Previous to what is shown in FIGS. 1A and 2A, there are process steps performed (i.e., growth steps, etch steps, etc.) so that a gate 10, 12, 14 and gate oxide 20, 22, 24 are provided on a substrate 30, 32, 34. As shown, the gate oxide 20, 22 is thicker in the ESD 40 and I/O 42 than the gate oxide 24 is in the core 44 (i.e., there is thick-oxide in the ESD 40 and I/O 42, and thin-oxide in the core 44). Hence, both series of Figures (i.e., FIGS. 1A through 1E, and FIGS. 2A through 2F) relate to DGO process technology.

Both FIGS. 1A and 2A illustrate thin-oxide N-LDD implantation ("n1"). While in FIG. 1A a mask 50, 52 is provided for the ESD and the I/O, in FIG. 2A a mask 54 is only provided for the I/O. Hence, the ESD receives thin-oxide N-LDD implantation ("n1") in the process shown in FIG. 2A, but not in the process shown in FIG. 1A (due to the mask 54).

Both FIGS. 1B and 2B illustrate thick-oxide N-LDD implantation ("n2"). While in FIG. 1B a mask 60 is provided only over the core, in FIG. 2B a mask 62 is also provided over the ESD. Hence, the ESD does not receive thick-oxide N-LDD implantation ("n2") in the process shown in FIG. 2B (due to the mask 62), but does in the process shown in FIG. 1B.

Both FIGS. 1C and 2C illustrate spacer formation 70, 72, 74, and both FIGS. 1D and 2D illustrate N+ source/drain implantation ("n+"). Both FIGS. 1E and 2E illustrate CoSi2 silicidation. As shown, a mask 80 is provided with the ESD in both cases over the gate. Both FIGS. 1F and 2F illustrate contact formation 90.

Figure 1F:
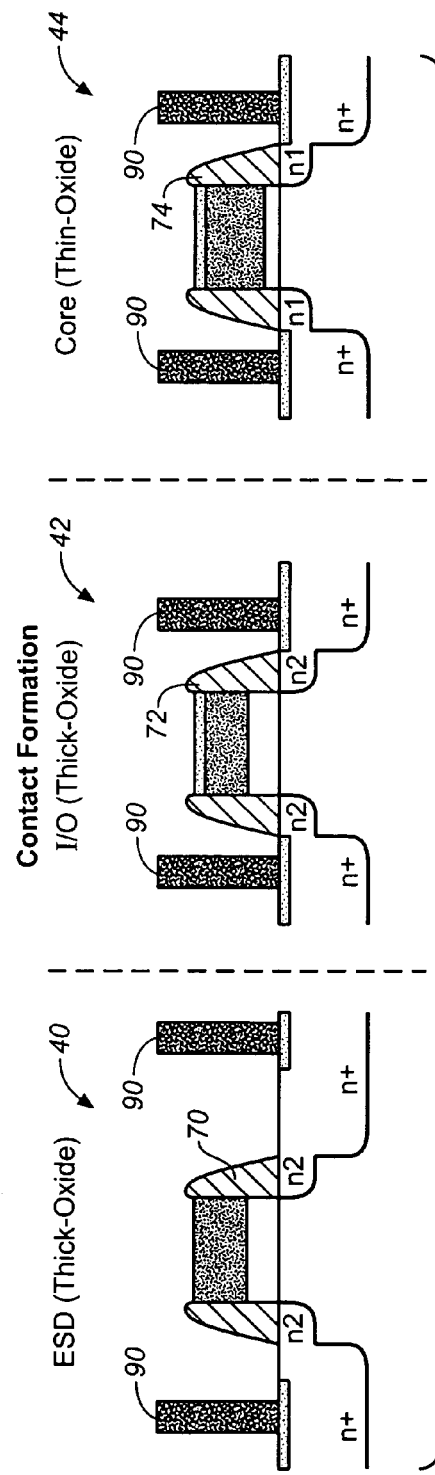
Figure 2F:
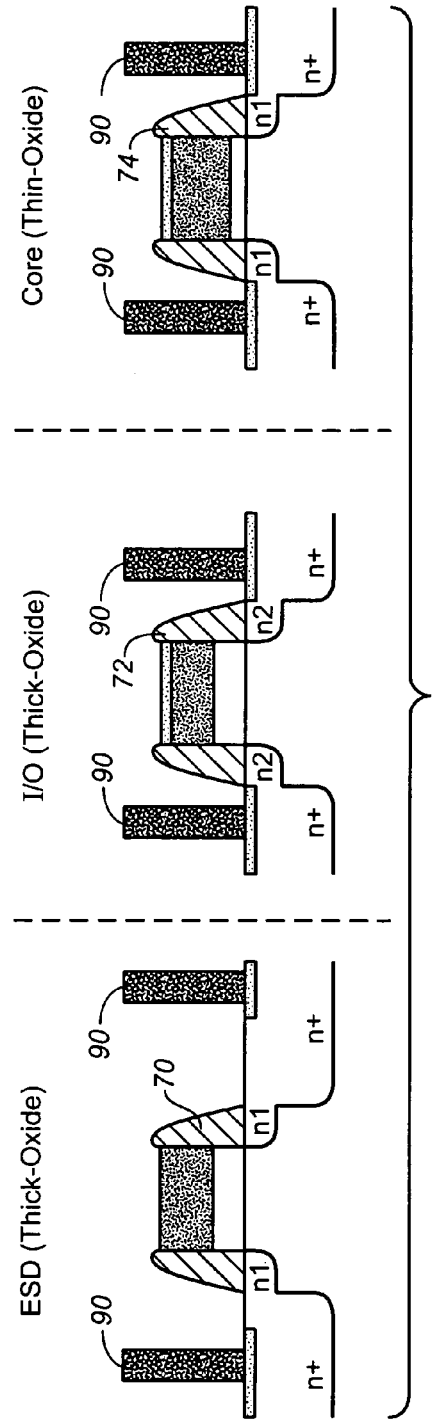

Comparing the resulting devices as shown in FIGS. 1F and 2F, it is seen that while there is thick-oxide N-LDD implantation ("n2") under the spacer 70 in the ESD device shown in FIG. 1F, there is thin-oxide N-LDD implantation ("n1") under the spacer 70 in the ESD device shown in FIG. 2F.

The following lists all possible DGO processes:
1. 3.3V/1.8V (e.g. 0.18 um technology) gate-oxide thickness: ~65 Å and ~35 Å.
2. 3.3V/1.2V (e.g. 130 nm technology) gate-oxide thickness: ~65 Å and ~22 Å.
3. 3.3V/1.0V (e.g. 90 nm technology)
4. 2.5V/1.0V (e.g. 90 nm technology)
5. 1.8V/1.0V (e.g. 90 nm technology)
   gate-oxide thicknesses: ~65 Å for 3.3V;
   ~50 Å for 2.5V;
   ~28 Å for 1.8V; and
   ~16 Å for 1.0V.

In TGO process, there are three standard N-type lightly doped drain (N-LDD) implantation masks. From 90 nm technology, TGO process has been developed and used in the industry. The standard process flow for TGO is shown in FIGS. 3A through 3G. In these Figures, "n1" is N-LDD implantation for thin gate-oxide transistors, "n2" is N-LDD implantation for thick gate-oxide transistors, and "n3" is N-LDD implantation for intermediate gate-oxide transistors. The I/O devices are not shown in FIGS. 3A through 3G. For doping concentrations, n1>n3>n2. In the traditional ESD protection approach, except for an additional silicide block, the ESD devices are the same as the I/O devices. Unlike the traditional ESD protection approach, the present invention uses intermediate N-LDD implantation ("n3") in thick-gate oxide ESD devices, as shown in FIGS. 4A through 4G. It should be noted that the process flows are identical in FIGS. 3A through 3G compared to FIGS. 4A through 4G, and this will be apparent from the following description.

Figure 3E:
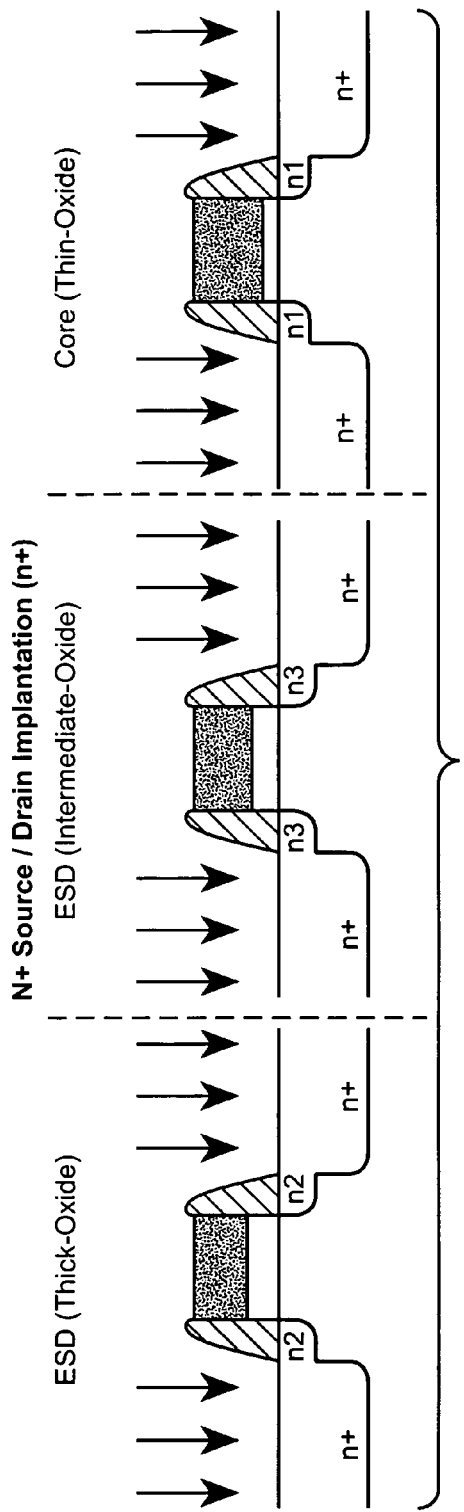
Figure 3F:
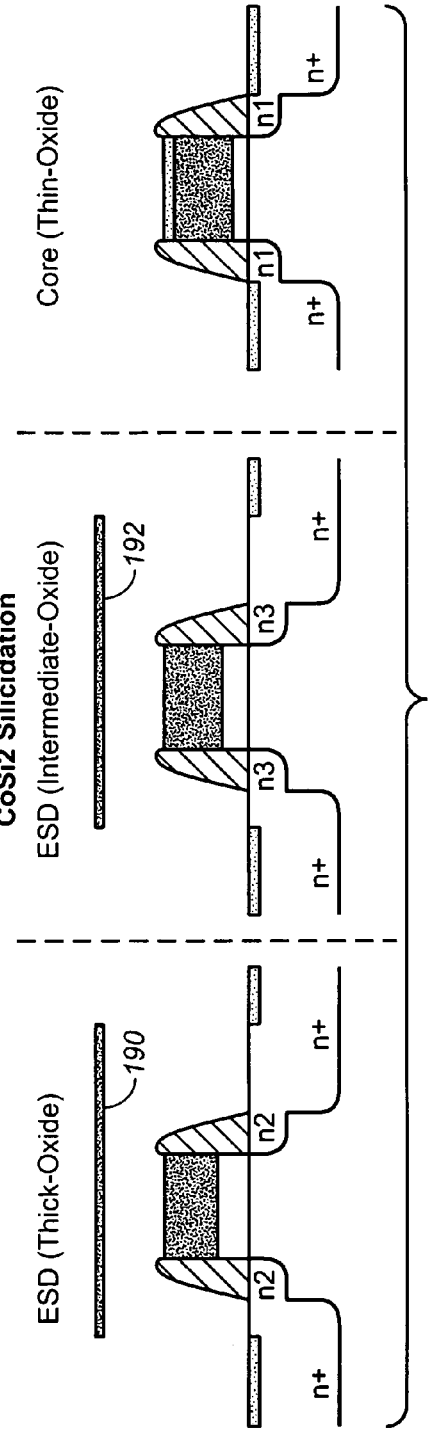
Figure 4F:
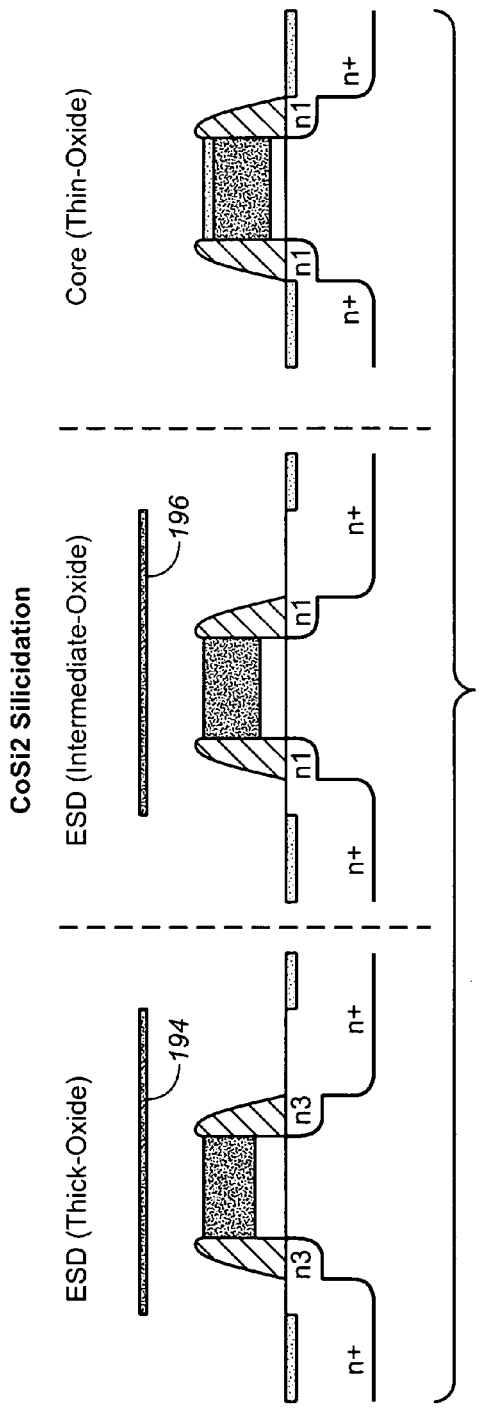

Previous to what is shown in FIGS. 3A and 4A, there are process steps performed (i.e., growth steps, etch steps, etc.) so that a gate 110, 112, 114 and gate oxide 120, 122, 124 are provided on a substrate 130, 132, 134. As shown, the gate oxide 120 is thicker in the one ESD 140 than the gate oxide 122 is in the other ESD 142, and the gate oxide 124 is the thinnest in the core 144 (i.e., there is thick-oxide in the one ESD 140, intermediate-oxide in the other ESD 142, and thin-oxide in the core 144). Hence, both series of Figures (i.e., FIGS. 3A through 3G, and FIGS. 4A through 4G) relate to TGO process technology.

Both FIGS. 3A and 4A illustrate thin-oxide N-LDD implantation ("n1"). While in FIG. 3A a mask 150, 152 is provided for both ESD's, in FIG. 4A a mask 154 is only provided for the ESD with intermediate-oxide. Hence, the intermediate-oxide ESD receives thin-oxide N-LDD implantation ("n1") in the process shown in FIG. 4A, but not in the process shown in FIG. 3A (due to the mask 152).

Both FIGS. 3B and 4B illustrate thick-oxide N-LDD implantation ("n2"). While in FIG. 3B a mask 160, 162 is provided over the intermediate-oxide ESD and the core, in FIG. 4B a mask 164, 166, 168 is provided also over all three structures. Hence, the thick-oxide ESD does not receive thick-oxide N-LDD implantation ("n2") in the process shown in FIG. 4B (due to the mask 164), but does in the process shown in FIG. 3B.

Both FIGS. 3C and 4C illustrate intermediate-oxide N-LDD implantation ("n3"). While in FIG. 3C a mask 170, 172 is provided over the thick-oxide ESD and over the core, but not over the ESD with intermediate-oxide, in FIG. 4C a mask 174, 176 is provided over the intermediate-oxide ESD and over the core, but not over the ESD with thick-oxide. Hence, the intermediate-oxide ESD receives intermediate-oxide N-LDD implantation ("n3") in the process shown in FIG. 3C, while the thick-oxide ESD is what receives the intermediate-oxide N-LDD implantation ("n3") in the process shown in FIG. 4C.

Both FIGS. 3D and 4D illustrate spacer formation 180, 182, 184, and both FIGS. 3E and 4E illustrate N+ source/drain implantation ("n+"). Both FIGS. 3F and 4F illustrate CoSi2 silicidation. As shown, a mask 190, 192, 194, 196 is provided over both ESD's in both cases, but is not provided over the core. Both FIGS. 3G and 4G illustrate contact formation 200.

Figure 4G:
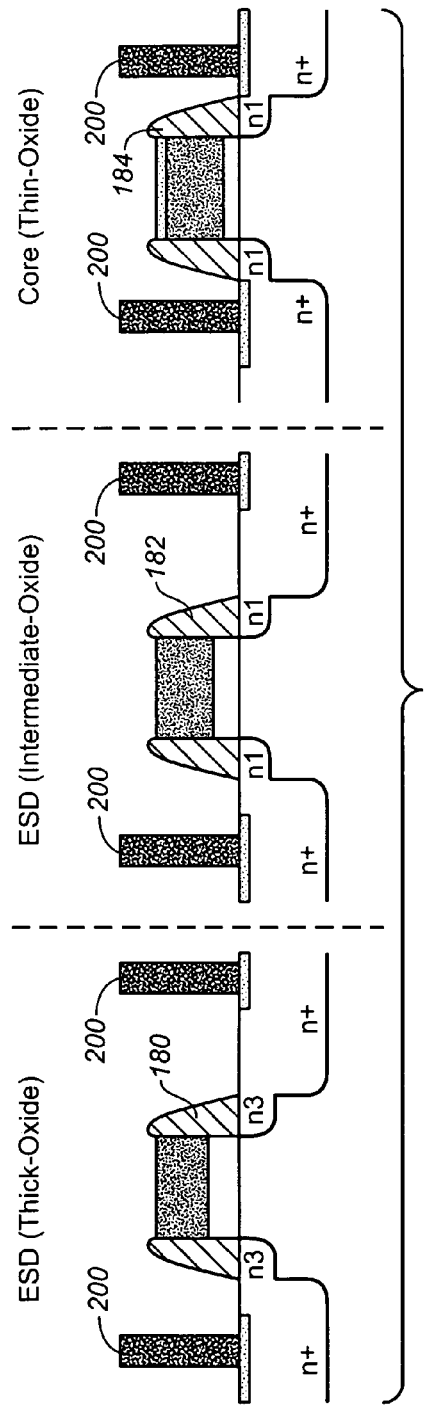

Comparing the resulting devices as shown in FIGS. 3G and 4G, the following can be seen:

In FIG. 3G, there is thin-oxide N-LDD implantation ("n1") under the spacer 184 in the core, there is thick-oxide N-LDD implantation ("n2") under the spacer 180 in the thick-oxide ESD, and there is intermediate-oxide N-LDD implantation ("n3") under the spacer 182 in the intermediate-oxide ESD.

In contrast, in FIG. 4G, there is thin-oxide N-LDD implantation ("n1") under the spacer 184 in the core as well as under the spacer 182 in the intermediate-oxide ESD, and there is intermediate-oxide N-LDD implantation ("n3") under the spacer 180 in the thick-oxide ESD.

The Following Lists all Possible TGO Processes:
1. 3.3V/1.8V/1.0V (e.g. 0.90 nm technology)
2. 2.5V/1.8V/1.0V (e.g. 0.90 nm technology)
  gate-oxide thicknesses: ~65 Å for 3.3V;
  ~50 Å for 2.5V;
  ~28 Å for 1.8V; and
  ~16 Å for 1.0V.

The Present Invention Provides:
1. Without extra process masks, a novel implantation method to improve ESD robustness is proposed for thick gate-oxide ggNMOSFET's based on the existing process flow in each technology.
2. In the present invention, triggering voltage and holding voltage of the novel devices are lower than those of the traditional thick gate-oxide ggNMOSFET's. Therefore, it provides very high ESD protection efficiency. That is, using the present invention, the ESD current would not trigger and flow into the protected NMOS drivers.
3. The failure current density of the novel ESD protection device using the present invention is at least 30% higher than the traditional thick gate-oxide ggNMOSFET's.
4. Because the present invention allows shorter drain-contact-gate-spacing (DCGS), the layout area of this novel ESD protection device can be reduced up to 40%.

Based on the existing process flow, a novel thick gate-oxide ggNMOSFET's can be created by recombining the LDD implantation. In this invention, LDD implantation for thick gate-oxide NMOS is removed from non-silicided ggNMOSFET's for ESD protection, but LDD implantation for thin or medium gate-oxide is added to non-silicided thick oxide ggNMOSFET's for ESD protection. This method can be achieved in the logic boolean operations while fabricating the reticle mask. The procedure is listed as below:

(1) Block thick gate-oxide LDD implantation over the non-silicided thick-oxide ggNMOSFET's area.
(2) Open thin gate-oxide LDD implantation over the non-silicided thick-oxide ggNMOSFET's area in the DGO process; or
(3) Open thin or medium gate-oxide LDD implantation over the non-silicided thick-oxide ggNMOSFET's area in the TGO process.

Figure 5B:
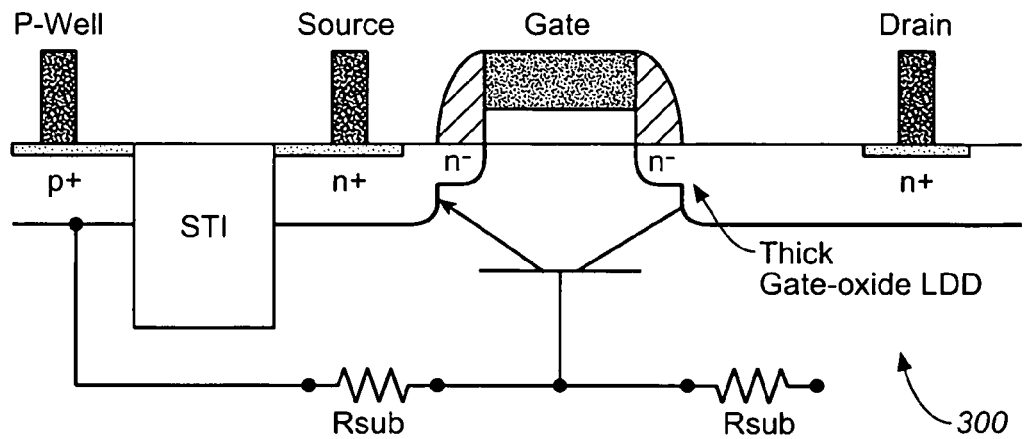
FIG. 5B provides a cross-sectional view of a ggNMOSFET without silicide where the ggNMOSFET is in accordance with an embodiment of the present invention.
Figure 5B:
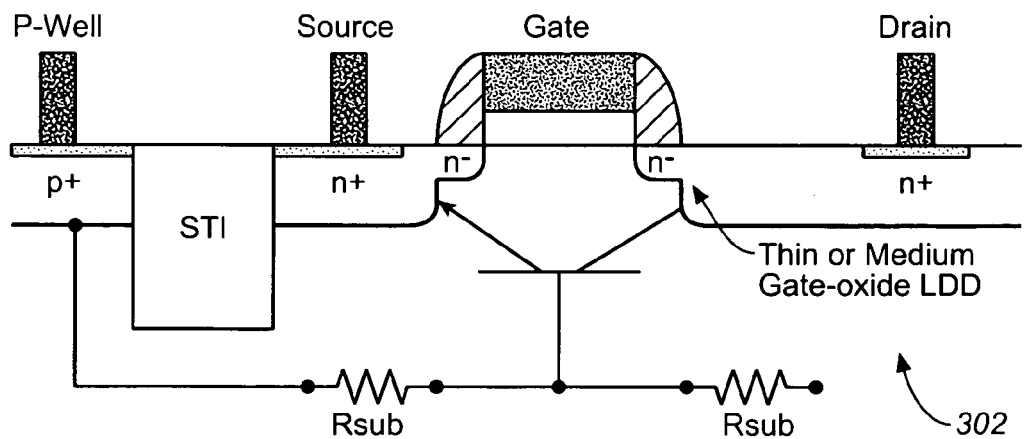

FIG. 5A provides a cross-sectional view of a standard ggNMOSFET 300 without silicide, and FIG. 5B provides a cross-sectional view of a ggNMOSFET 302 without silicide where the ggNMOSFET is in accordance with an embodiment of the present invention. Although they are similar to each other in the cross-sectional views, LDD doping concentration of novel ggNMOSFET's is higher than that of standard ggNMOSFET's. Therefore, the ESD protection performance of novel ggNMOSFET's can be improved.

In order to verify the present invention, LSI Logic 130 nm technology (Gflx) for DGO process and TSMC 90 nm technology (G90) for TGO process have been studied and analyzed by Transmission Line Pulse Generator (TLP). In the 130 nm technology, 2.5V/3.3V LDD implantation is used in thick gate-oxide devices and 1.2V LDD implantation is used in thin gate-oxide devices. In G90 technology, 2.5V/3.3V LDD implantation, 1.8V LDD implantation and 1.0V LDD implantation are used in thick gate-oxide devices, medium gate-oxide devices and thin gate-oxide devices, respectively.

Figure 6:
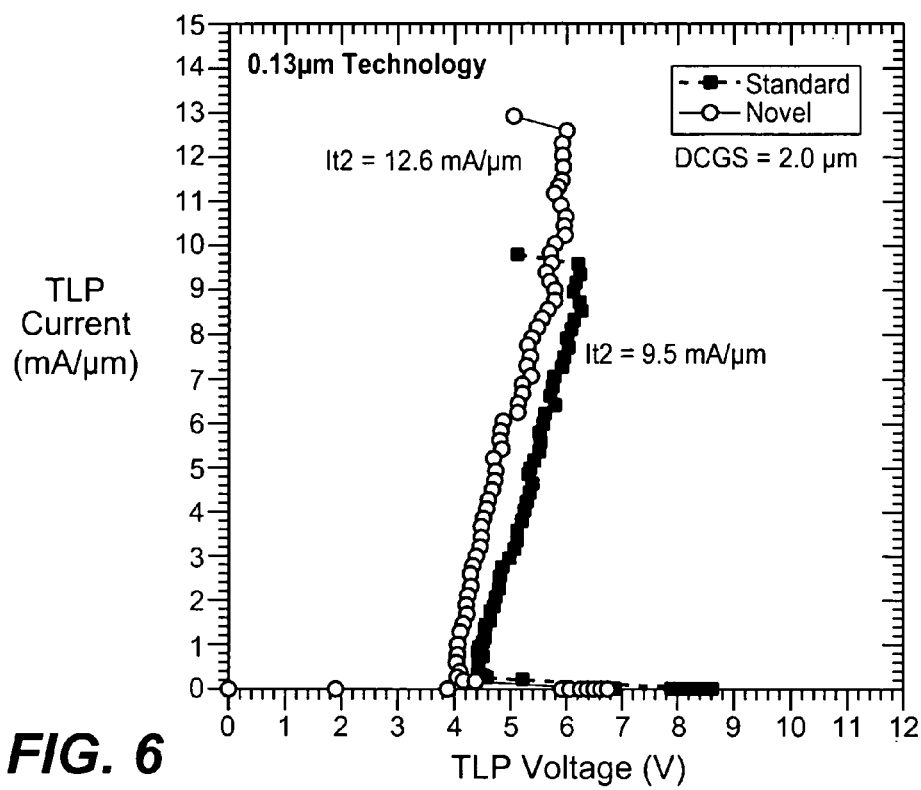
FIG. 6 shows the TLP I–V results for novel and standard thick gate-oxide ggNMOSFET's in 130 nm (Gflx) technology.

FIG. 6 shows the TLP I–V results for novel and standard thick gate-oxide ggNMOSFET's in 130 nm (Gflx) technology. For DGO process in Gflx technology, FIG. 6 shows that triggering voltage (Vtr), holding voltage (Vh) and failure current density (It2) of the novel ggNMOSFET's are around 6.8V, 4.0V and 12.6 mA/um, respectively. For the standard ggNMOSFET's, Vtr~8.6V, Vh~4.4V and It2~9.5 mA/um. From this figure, it is clearly shown that the failure current density of the present invention is at least 30% higher than the standard ggNMOSFET's in 130 nm technology, which ESD robustness is enhanced. Furthermore, Vtr and Vh of this invention are lower than the standard ggNMOSFET's which means that the present invention can provide very high ESD protection efficiency.

Figure 7:
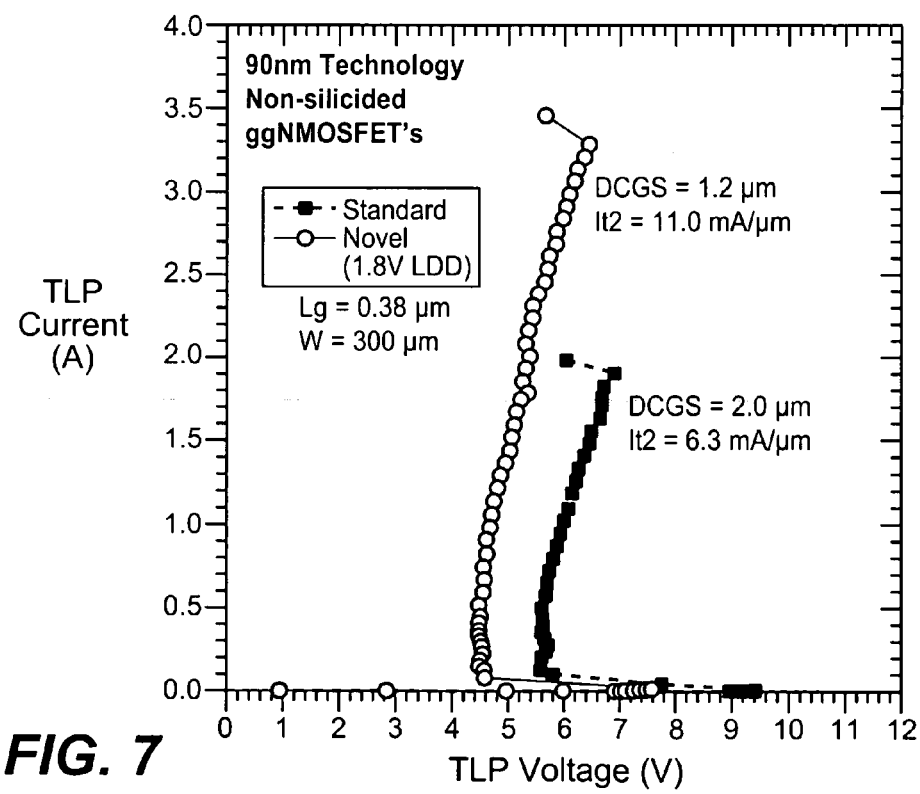
FIG. 7 shows the TLP I–V results for novel and standard thick gate-oxide ggNMOSFET's in 90 nm (G90) technology.

FIG. 7 shows the TLP I–V results for novel and standard thick gate-oxide ggNMOSFET's in 90 nm (G90) technology. For TGO process in G90 technology, by using 1.8V LDD implantation in the novel ggNMOSFET's, FIG. 7 shows that Vtr~7.6V, Vh~4.5V, and It2~11.0 mA/um for the present invention, and Vtr~9.4V, Vh~5.6V, and It2~6.3 mA/um for the standard thick gate-oxide ggNMOSFET's. In this technology, it can be seen that the failure current density of the novel device using the present invention is ~75% higher than the standard thick gate-oxide ggNMOSFET's. Same as Gflx technology, this novel device using this invention can provide very high ESD protection efficiency due to lower Vtr and Vh. In this figure, it should be noted that the novel ggNMOSFET's with drain contact to gate spacing (DCGS)=1.2 um using this invention is much more robust than the standard ggNMOSFET's with DCGS=2.0 um. It means that the layout area in this invention can be reduced.

Figure 8:
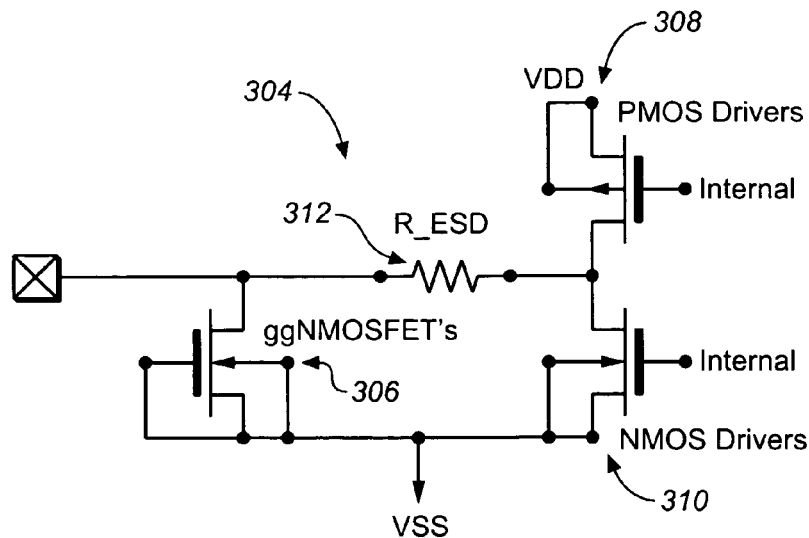
FIG. 8 illustrates a traditional I/O ESD protection method, which is also called a "ballasting protection method"

To explain the ESD protection efficiency of non-silicided ggNMOSFET's, a traditional I/O ESD protection method 304 is shown in FIG. 8, which is also called a "ballasting protection method". In FIG. 8, non-silicided ggNMOSFET's 306 are the primary ESD protection device and the drivers 308, 310 are silicided transistors to being protected which are driven by the internal circuits. R_ESD is the ballast resistor 312 which is to limit the ESD current flowing into the silicided drivers. In the traditional ESD protection, triggering voltages (Vtr) of standard ggNMOSFET's and drivers are identical, so designing R_ESD becomes very important to limit the ESD current flowing into the drivers. However, by using the novel thick gate-oxide ggNMOSFET's, designing R_ESD is not a critical factor and can be ignored.

Figure 9A:
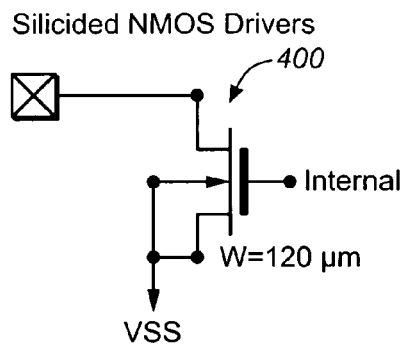
FIGS. 9A through 9C illustrate three test structures for the purpose of ESD protection efficiency for ggNMOSFET's in accordance with an embodiment of the present invention.
Figure 9B:
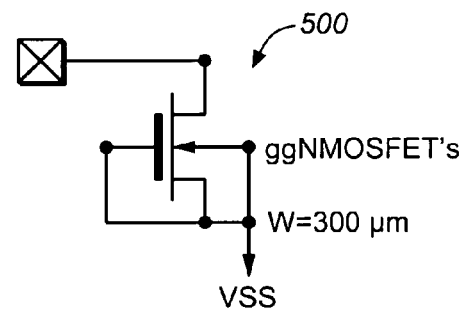
Figure 9C:
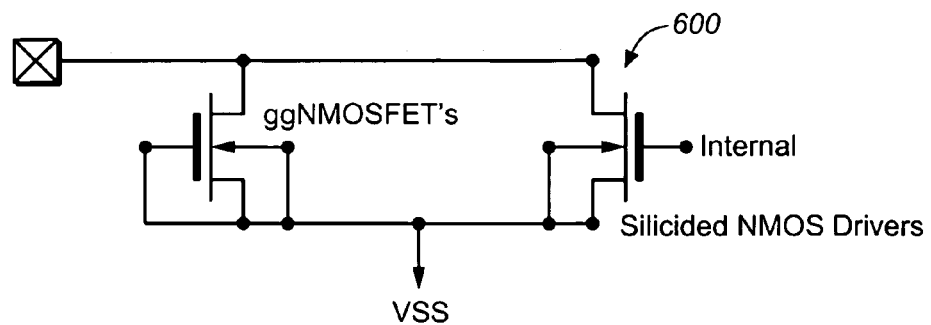
Figure 10:
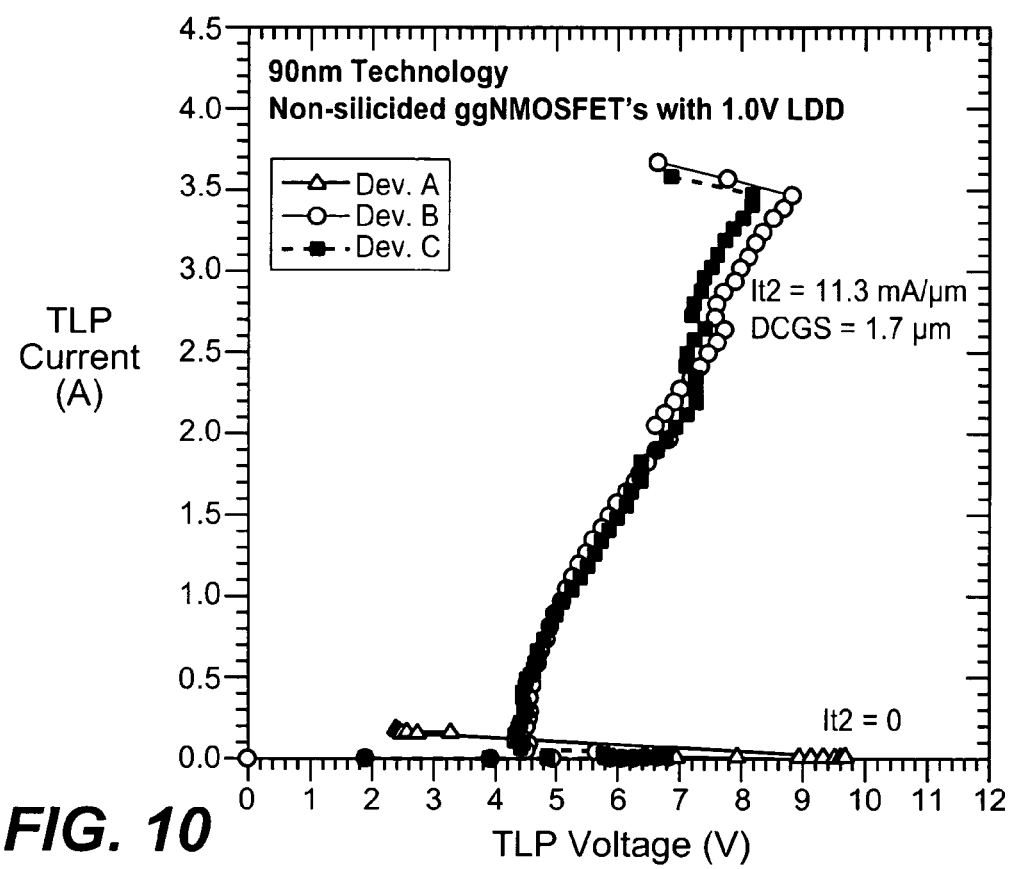
FIG. 10 illustrates TLP pulsed I–V characteristics of ESD protection efficiency of novel ggNMOSFET's without salicide in 90 nm technology.

To verify this, three devices 400, 500, 600 are designed as shown in FIGS. 9A through 9C. FIG. 9A illustrates NMOS drivers with silicide, FIG. 9B illustrates ggNMOSFET's without silicide, and FIG. 9C is a combination of what is shown in FIGS. 9A and 9B—i.e., the deice shown in FIG. 9B shunt with the device shown in FIG. 9A. From FIG. 10, it can be seen that It2~0 for Dev_A, and It2~11.3 mA/um for Dev_B and Dev_C. The TLP I–V characteristics of Dev_B and Dev_C are almost identical. Therefore, it can be concluded that using this novel device the ESD current never trigger and flow into the silicided drivers to being protected.

By analyzing and studying Gflx and G90 technologies, the present invention has been verified. The data also shows that it is very useful to use this invention as the ESD protection device. In Gflx technology, it has been proved that this novel thick gate-oxide ggNMOSFET's withstand 500 hours burn-in tests, which means that this novel device will not have other EOS issues.

While embodiments of the present invention are shown and described, it is envisioned that those skilled in the art may devise various modifications of the present invention without departing from the spirit and scope of the appended claims.

What is claimed is:

1. An ESD protection circuit of a thick gate-oxide grounded-gate NMOSFET, said ESD protection circuit comprising: a substrate; a thick-oxide on the substrate; a first spacer on the substrate proximate the thick-oxide; and thin-oxide N-LDD implantation under the first spacer in the substrate; wherein the NMOSFET comprises an I/O which comprises a thick-oxide, a second spacer proximate the thick-oxide of the I/O, and thick-oxide N-LDD implantation disposed under the second spacer, wherein the thin-oxide N-LDD implantation has a higher doping concentration than does the thick-oxide N-LDD implantation which is disposed under the second spacer; wherein the NMOSFET comprises a core which comprises a thin-oxide, a third spacer proximate the thin-oxide of the core, and thin-oxide N-LDD implantation disposed under the third spacer, wherein the thin-oxide N-LDD implantation has substantially the same doping concentration than does the thin-oxide N-LDD implantation which is disposed under the third spacer.

2. An ESD protection circuit as recited in claim 1, wherein the thin-oxide N-LDD implantation in the substrate is disposed generally between contacts of the thick gate-oxide grounded-gate NMOSFET and the thick gate-oxide.

3. An ESD protection circuit as recited in claim 1, wherein the ESD protection circuit is configured to provide ESD protection without utilizing a floating gate transistor.

* * * * *